(12) United States Patent
Hanina et al.

(10) Patent No.: US 7,170,542 B2
(45) Date of Patent: Jan. 30, 2007

(54) SYSTEM AND METHOD FOR PROVIDING HIGH BRIGHTNESS ILLUMINATION

(75) Inventors: Golan Hanina, Rishon Lezion (IL); Boris Kling, Rehovot (IL)

(73) Assignee: Orbotech Ltd. (IL)

( * ) Notice: Subject to any disclaimer, the term of this patent is extended or adjusted under 35 U.S.C. 154(b) by 334 days.

(21) Appl. No.: 10/762,246

(22) Filed: Jan. 23, 2004

(65) Prior Publication Data

US 2004/0189787 A1   Sep. 30, 2004

Related U.S. Application Data

(60) Provisional application No. 60/441,758, filed on Jan. 23, 2003.

(51) Int. Cl.
*B41J 2/455* (2006.01)
*B41J 27/00* (2006.01)

(52) U.S. Cl. .................. 347/233; 347/243; 347/260

(58) Field of Classification Search ................. 347/130, 347/132, 144, 239, 255, 241–245, 256–261, 347/233, 238, 231; 340/870.13; 315/169.3; 353/30; 348/742; 372/98; 360/23; 370/280, 370/294

See application file for complete search history.

(56) References Cited

U.S. PATENT DOCUMENTS 3,764,799 A   10/1973 Schulz
3,877,171 A   4/1975 Sloop et al.
4,826,269 A   5/1989 Streifer et al.
5,327,451 A * 7/1994 Walker et al. ................. 372/98
5,634,711 A   6/1997 Kennedy et al.
5,788,352 A * 8/1998 Montroy et al. .............. 353/30
5,845,981 A   12/1998 Bradley
5,929,979 A   7/1999 Okino et al.
6,133,986 A   10/2000 Johnson
6,175,440 B1  1/2001 Conemac
6,379,867 B1  4/2002 Mei et al.
6,425,669 B1  7/2002 Mei et al.
6,456,205 B1  9/2002 Russell et al.
6,473,237 B2  10/2002 Mei
6,508,554 B2  1/2003 Hatakeyama et al.
6,617,801 B2 * 9/2003 Ishizuka et al. ......... 315/169.3
6,753,931 B2 * 6/2004 Kane et al. ................. 348/742
2002/0126479 A1  9/2002 Zhai et al.

* cited by examiner

*Primary Examiner*—Hai Pham
(74) *Attorney, Agent, or Firm*—Sughrue Mion, PLLC

(57) ABSTRACT

An illumination system includes a plurality of solid state light emitters and a scanner operative to sequentially receive light from the plurality of solid state light emitters and to provide a time-multiplexed light output. The solid state light emitters are each operated in pulse mode to increase their brightness relative to the light output of similar emitters operating in continuous mode. The time multiplexed light output is a generally continuous output having a brightness that is greater than the brightness of the output of similar emitters operating in continuous mode. The time multiplexed light output is useful in photolithography and machine vision applications.

39 Claims, 2 Drawing Sheets

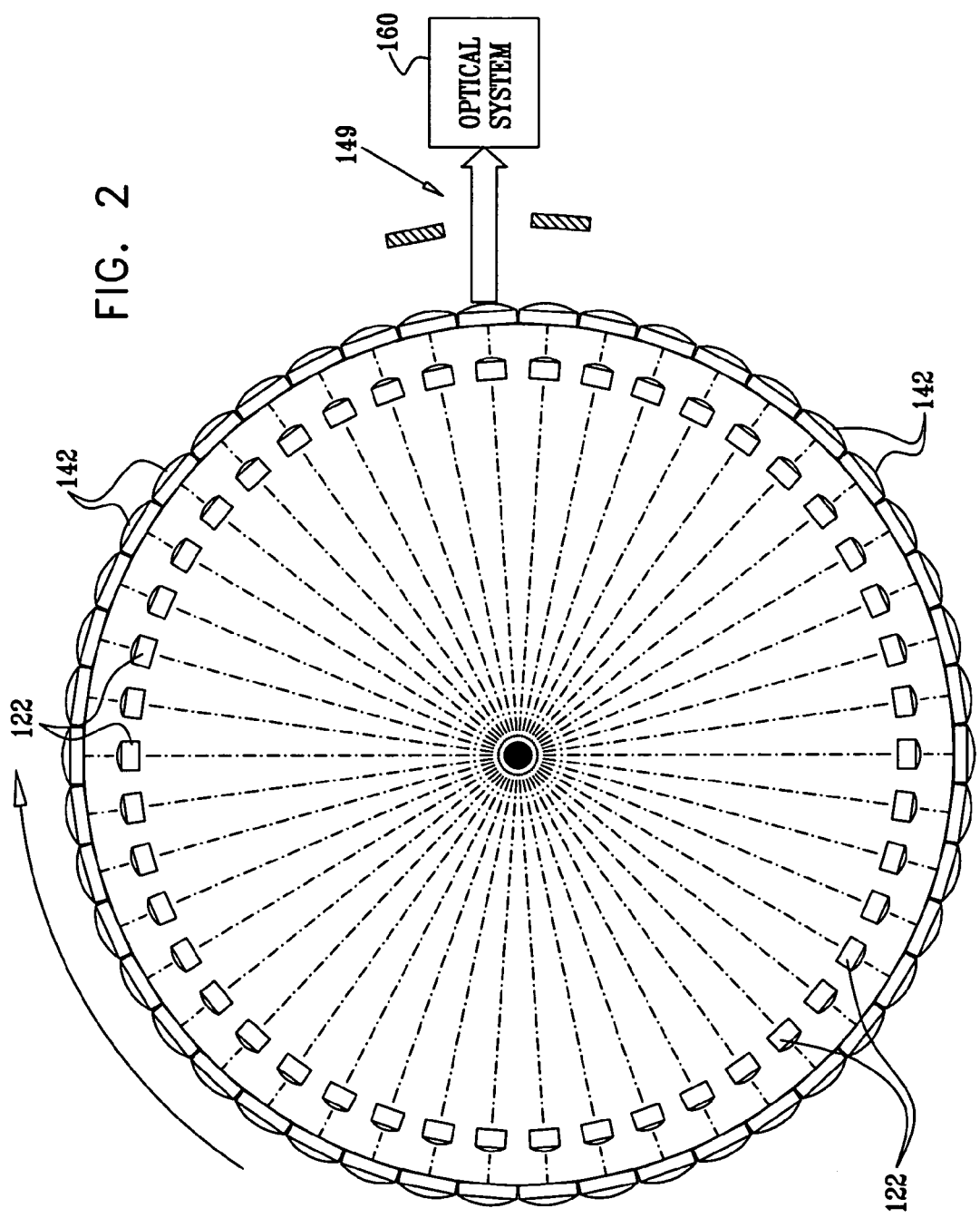

SYSTEM AND METHOD FOR PROVIDING HIGH BRIGHTNESS ILLUMINATION

The present application claims the benefit of U.S. provisional patent application 60/441,758 filed on Jan. 23, 2003 and entitled "Direct Imaging System Employing High Brightness Non-Coherent Illumination", the disclosure of which is incorporated by reference in its entirety.

FIELD OF THE INVENTION

The present invention relates to systems and methods for generating high brightness illumination. Such high brightness illumination may be employed in imaging systems for recording information on photosensitive surfaces and optical inspection systems.

BACKGROUND OF THE INVENTION

Various optics applications, including for example image recording and image acquisition, optimally require high brightness illumination. Brightness for a luminous source is defined as a luminance intensity (power) per unit area per unit solid angle.

It is well known that because of the law of conservation of brightness, the brightness of a source determines a theoretical maximum brightness of illumination that can be delivered to a surface. If a location on a surface is to be illuminated with illumination having a given optical numerical aperture (NA) using all of light available from a given source of illumination, then no more light can be provided to that location merely by simplistically combining illumination from additional emitters.

There are however several special cases in which illumination from several emitters can be combined in order to increase apparent brightness. These include, for example, wavelength multiplexing of narrow spectrum sources and polarization combination. Such methods require that the emitters emit light having a narrow spectral content or emit light that is polarized. The illumination that results from such multiplexing has increased spectral content or becomes non-polarized.

A typical application for recording information on a photosensitive surface is the direct imaging of electrical circuit patterns on a photoresist clad printed circuit board substrate. Widely used commercially available photoresist products are sensitive to UV light (about 370 nm) and conventional direct imaging exposure systems employ modulated UV lasers. Considerable research and development work is being applied to the development of inexpensive high brightness semiconductor lasers, however these lasers still do not emit light in a spectral bandwidth able to expose widely used commercially available photoresist products. Conversely, light emitting diodes having a spectral bandwidth that is able to expose commercially available photoresist products are now being introduced to the marketplace. These new light emitting diodes however typically do not provide illumination having sufficient brightness to be used in commercially viable exposure systems.

A light source for providing high power incoherent light with a laser array is described in U.S. published patent application 2002/126479 A1.

SUMMARY OF INVENTION

The present invention seeks to provide improved systems and methods for combining illumination from multiple emitters to increase apparent brightness.

The present invention further seeks to provide systems and methods for illuminating a location on surface with multiple emitters of illumination such that the brightness delivered to the surface, over time a given time interval, is brighter than the brightness of illumination emitted by any individual emitter.

The present invention further seeks to provide systems and methods for combining light from multiple emitters of illumination without altering a spectral bandwidth characteristic of the emitters.

An embodiment of the present invention further seeks to provide a system and method for delivering high brightness non-coherent light from a plurality of non-coherent light sources.

The present invention further seeks to provide systems and methods for combining light from multiple emitters of illumination without altering a polarization characteristic of the emitters.

The present invention further seeks to provide systems and methods for combining light from a plurality of non-laser emitters of illumination to increase an apparent brightness over time compared to illumination emitted by any individual emitter.

The present invention further seeks to provide systems and methods for combining light from a plurality of illumination sources using time multiplexing.

The present invention further seeks to provide systems and methods for recording images on a photosensitive surface using a high intensity illumination source provided by a plurality of emitters, in which the continuous brightness of the source over a given time interval is greater than the brightness of illumination provided by any individual emitter over the same time interval.

The present invention further seeks to provide systems and methods for recording images on a photosensitive surface employing at least two pulsed non-coherent emitters of illumination providing a combined light output.

In accordance with a broad aspect of the present invention there is thus provided an illumination source including a plurality emitters emitting pulsed illumination. Illumination pulses from each of the emitters are combined, for example by scanning, to provide a time multiplexed light output. Over a time interval, the time multiplexed light output has a greater brightness than illumination provided by any of the individual emitters output light over the same time interval.

In accordance with another broad aspect of the present invention, there is thus provided an illumination source comprising a plurality of Light Emitting Diodes (LEDs) operable in a continuous mode of operation to emit light having a first brightness characteristic, and operable in a pulsed mode to emit light having a second, essentially instantaneous, brightness characteristic greater the first brightness characteristic. Pulsed light emitted by the LEDs is combined by time multiplexing.

In accordance with an embodiment of the invention, LEDs are configured and arranged around the periphery of a drum such that each of the LEDs emits light directed to illuminate a radial location away from the drum. The LEDs are pulsed in sequence as the drum is rotated such that each LED emits a pulse of light that is passed to an optical system. The pulsed light from each of the LEDs reached the optical system at substantially the same angle of incidence.

In accordance with another embodiment of the invention, LEDs are configured and arranged in a loop-like arrangement in which each of the LEDs emits light directed illuminate a location in the center of the loop. A sequencer is provided to drive each of the LEDs such that they emit pulsed light in a sequence. A rotating scanner, such as a mirror, is provided at the center of the loop to direct light emitted by the LEDs to a location outside the loop where it illuminates a surface. The mirror is rotated generally synchronously with the sequence of pulsing of the LEDs to receive pulses as they are emitted. Light pulses from each LED are received by the rotating mirror at substantially the same angle of incidence to preserve brightness of light emitted by the LEDs.

In accordance with an embodiment of the invention, there is provided a direct imaging device including an illuminator and spatial light modulator. The illuminator includes a high brightness source of illumination illuminating a surface of the spatial light modulator, and the spatial light modulator is operative to spatially modulate the light and direct the modulated light to record a pattern on a photosensitive surface. In accordance with an embodiment of the invention, the source of illumination includes at least two LEDs operating in pulsed mode. The respective light outputs of the LEDs are combined to provide a high-brightness light beam.

There is thus provide in accordance with an embodiment of the invention a system for illuminating a surface including a plurality of light emitting diodes, each light emitting diode being operable in a continuous mode of operation to output light having a continuous operation illumination characteristic; a sequencer intermittently operating said plurality of light emitting diodes in a sequence such that each light emitting diode in said plurality of light emitting diodes outputs light having an illumination characteristic greater than said continuous operation illumination characteristic; and a collector collecting light from the plurality of light emitting diodes and directing light therefrom to a surface.

There is thus provide in accordance with another embodiment of the invention a system for directly recording an image on a photosensitized surface, including at least one light emitting diode intermittently emitting light having a light characteristic exceeding a continuous operation light characteristic for such diode when operated in a continuous mode of operation; and a spatial light modulator receiving light from said at least one light emitting diode and directing the light to impinge on a photosensitized surface in a spatial pattern.

Various embodiments of the invention include one or more of the following additional features:

The light characteristic enhanced by time multiplexing is brightness.

The at least one light emitting diode comprises a plurality of light emitting diodes intermittently operated in a sequence.

The spatial light modulator is a light valve such as a LCD panel, a GLV or a digital micro-mirror device.

The light emitting diodes output light having a sub-400 nm spectral characteristic.

BRIEF DESCRIPTION OF DRAWINGS

The present invention will be understood and appreciated more fully from the following detailed description, taken in conjunction with the drawings in which:

FIG. 2 is a top view diagram of another system for time multiplexing light from pulsed solid state emitters in accordance with another embodiment of the invention.

DETAILED DESCRIPTION

Figure 1:
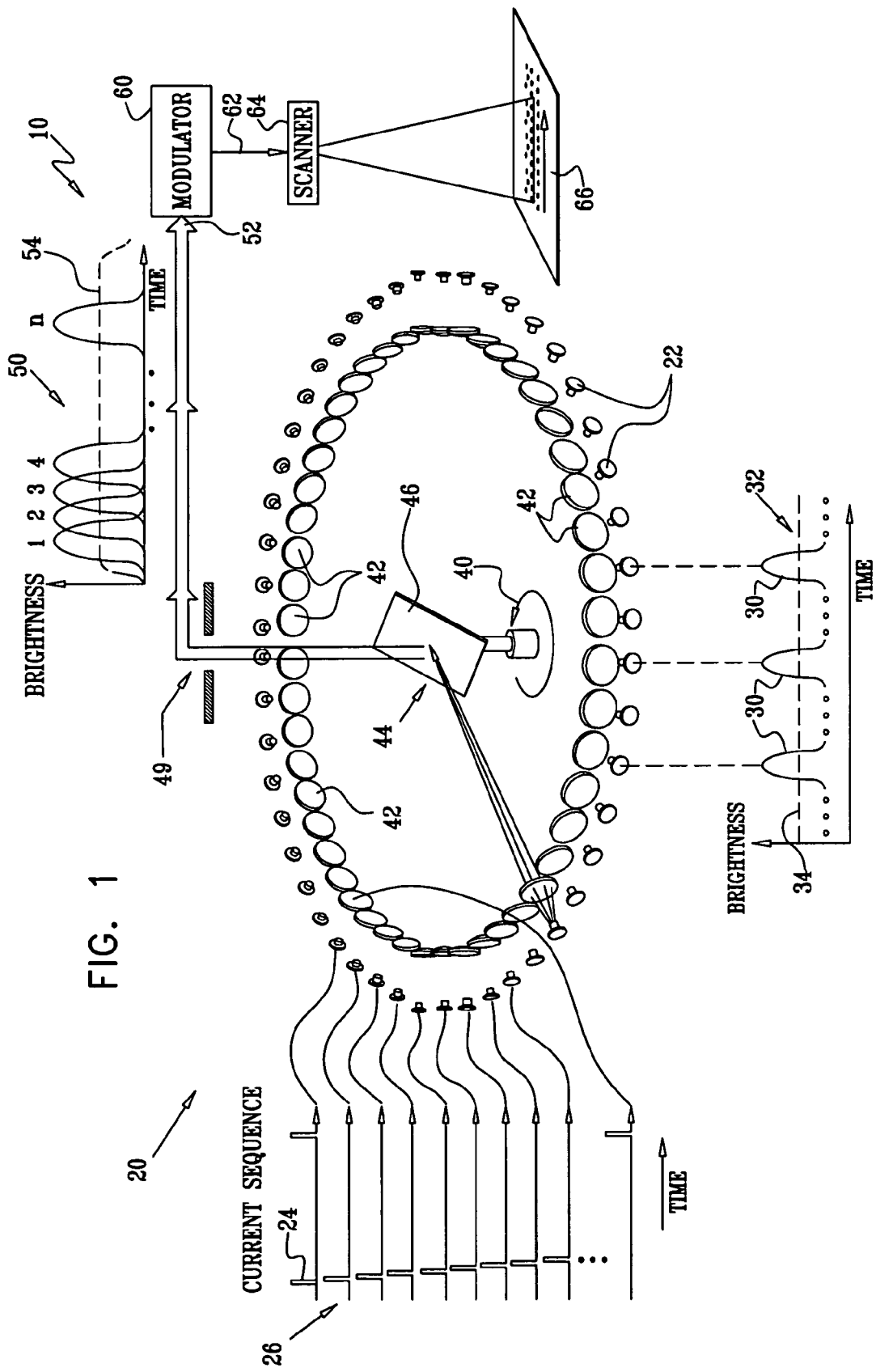
FIG. 1 is a simplified part pictorial part block diagram of a system for time multiplexing light from pulsed solid state emitters in accordance with an embodiment of the invention.

It is known that Light Emitting Diodes (LEDs) are a low cost, high efficiency and reliable source of light. LEDs emitting light in nearly any spectral color are now available and have been proven to be a very cost effective light source. The following disclosure describes various systems and methods for increasing the effective brightness of light emitted by a light source, for example a solid state light emitter such as a LED. Such increased brightness is very useful for the purpose of illumination in numerous applications. For example, high brightness light is useful for recording patterns on a photosensitive surface and for illuminating a surface during image acquisition, as may be required in machine vision applications.

In general, light emitted by solid state emitters such as LEDs increases as a function of input current, up to a limit set by thermal effects. When the current driving an LED is increased beyond a nominal value, the incremental increase in light emission becomes relatively small. Moreover, the usable life time of the LED is reduced. Consequently, LEDs are typically rated for being driven in a continuous mode using a nominal operating current.

A momentary increase in the light emission of a LED can be achieved by strobing the LED using relatively high power current pulses of relatively short duration. In this manner, the LED emits light of higher intensity in response to each pulse of current. The LED is allowed to cool down in between pulses to mitigate thermal limitations affecting brightness and degradation. In pulse mode, although each pulse has, for the short temporal duration of a pulse, an intensity above a continuous mode intensity, the result of operation in pulsed mode, when averaged, is a light intensity that is similar to the intensity during continuous mode operation.

For example, assume that a nominal average current driving a LED is about 20 mA. A current pulse having a pulse duration of less than 1.0 msec, can be as high as 1 Amp without effecting normal life time of the LED, provided that the average current, that is to say after averaging the current of each of the pulses over time, is within the normal operating current conditions. In this example the duty cycle of a 1 Amp pulse should be less then about 2% to ensure that the average current remains below the nominal recommended average current of 20 mA. When operating a solid state emitter in a pulse mode at such a pulse duty cycle, Applicants have found that the instantaneous intensity of a light pulse emitted by an LED can be about 50 times greater in comparison to the nominal value of light emitted in response to a 20 mA continuous current. Because the area of the emitting surface of the LED and its angles of emission are constant whether operated in continuous mode or in pulse mode, the brightness of an LED operated in a pulse light emission mode, in the example given, is 50 fold enhanced for the duration of the pulse in comparison to an LED operated in a continuous light emission mode.

In accordance with an embodiment of the invention, relatively high intensity light pulses, provided by a plurality of solid state light emitters, such as LEDs, operated in a pulse mode, are combined by time multiplexing to provide a generously continuous light source. The resultant light source has an average light emission, and brightness, that is greater over time than the rated average emission of an individual LED. In effect, the pulses of several light emitters are temporally interleaved and collected by a scanner operative to receive light from each of the emitters and combine the pulses into a generally continuous stream of high peak power light pulses.

Reference is now made to FIG. 1 which is a part simplified pictorial and part block diagram of a system 10 for recording a pattern on a substrate employing a high brightness illuminator 20 in accordance with and embodiment of the present invention. The high brightness illuminator 20 includes a plurality of solid state light emitters 22, such as LEDs or optionally laser diodes, arranged in a loop or ring configuration. Each LED is driven by a high power current pulse 24, as seen in current sequence graph 26. In accordance with an embodiment of the invention, the power of each current pulse is substantially higher than the power of current employed to operate a LED in a continuous mode or steady state of operation. It is noted that in FIG. 1, for the sake of clarity, only some of the LEDs 22 are shown as driven by a current pulse 24, it being understood that in an operative system each of the LEDs 22 would be connected to a source of electric current.

LEDs 22 are sequentially operated in a pulsed mode of operation, each driven by current pulse 24, to output a light pulse 30 as seen light pulse graph 32. The current pulses are provided by a sequencer (not shown), as know in the art, to pulse LEDs 22. Light pulse graph 32 shows only part of a sequence of light outputs of LEDs 22. The LEDs 22 each emit a pulse of high brightness light according to a predetermined sequence; in the example seen in FIG. 1, each of the LEDs 22 emits a light pulse one at a time in order around the loop. It is noted that the instantaneous intensity and brightness of pulsed light output of LEDs 22 is higher in comparison to a continuous output of the LED. Thus, as seen in graph 32, each of light pulses 30 has an increased level of brightness in comparison to a continuous output rated brightness, indicated by line 34.

In the embodiment seen in FIG. 1, the pulses are timed so that LEDS 22 output light pulses one at time, traveling around the loop. In accordance with an embodiment of the invention, the sequencer preferably activates each LED 22 such that pulses 30 are emitted in generally non-overlapping time intervals. It is appreciated, however, that in some applications it may be useful to sequence the LEDs 22 such that adjacent LEDs emit pulses in partially overlapping time intervals, or non-adjacent LEDs are driven to emit light pulses in sequence. As seen in FIG. 1, on average at any given moment at least one LED is emitting light, and at least one LED is not emitting light. In order to prevent heating affects of the LEDs, illuminator 20 is designed to ensure that there are a sufficient quantity of LEDs 22, each having a respective duty cycle, such that the LEDs 22 are able to cool down in the time interval between pulses to avoid thermal degradation and to optimize the light intensity or brightness of each pulse 30.

In the embodiment seen in FIG. 1 a lens 42, such as a collimating lens, is associated with each LED 22 to collimate light emitted by the LED and direct it to a location located generally in the center of the loop. A scanner 44, including for example a mirror 46 rotating in the direction indicated by arrow 48, is located in the center of the loop of LEDs 22. Mirror 46 is angled at about 45° and rotates synchronously with the pulsing of LEDs 22 to receive the light emission of each LED 22 at a time corresponding to emission of a pulse. Thus as scanner 44 scans LEDs 22 as they sequentially output a high intensity light pulse, the light emitted by each of LEDs 22 impinges on mirror 46 at generally the same angle of incidence and is directed to an entrance aperture 49 of an optical system. Consequently, light from each of the LEDs 22 reaches entrance aperture 49, rotated, but at the same angle.

As seen in FIG. 1, a sequence of temporally offset emitted pulses 50 form, for example, an essentially continuous light output 52 directed to an electro optical system. The pulses 50 have an intensity, or brightness, exceeding the intensity or brightness of LEDs operating in a continuous mode as indicated by broken line 54. This time multiplexes the pulses so that continuous light output 52 has a generally continuous intensity, or brightness, exceeding that of a LED operating in a continuous mode of operation.

In accordance with an embodiment of the invention, the electro-optical system includes, for example, a modulator 60 modulating a pattern in the light output 52, to form a modulated light output 62, and an image scanner 64 scanning the modulated light output 62 across a photosensitive surface 66 such as a photo-resist deposited on an electrical circuit substrate. In accordance with an embodiment of the invention, an exposed electrical circuit substrate is suitably developed and subsequently processed to form an electrical circuit, such as a printed circuit board.

In accordance with an embodiment of the invention, entrance aperture 49 is disposed along the axis of the loop of LEDs 22. Thus an optical system having a given NA is operative to illuminate a location with enhanced brightness provided by the LEDs 22 operating in pulse mode. This forms a very high intensity, or high brightness, quasi-CW (continuous wave) light. Accordingly, the average brightness of the collection of LEDs 22, averaged over time, is substantially increased relative to the average continuous output of a single LED. It is noted that synchronicity between the scanner 44 and the sequence of pulses facilitates time multiplexing the light pulses from each of the pulsed LEDs onto entrance aperture 49 of the optical system, thereby increasing the total brightness output of light output 52.

Referring now to FIG. 2, which is top view diagram of a system for producing a time-multiplexed light output in accordance with another embodiment of the invention, a plurality of LEDs 122 are mounted, for example, around the outer perimeter of a rotating drum. The LEDs 122 are configured to emit light away from the drum. Optics, including for example one or more collimating lenses 142, are arranged to collect light from one LED at a time as the drum is rotated. The LEDs 122 are driven to intermittently to emit light-pulses of short duration and enhanced intensity or brightness, such that as the drum is rotated each LED emits a light pulse at least during the time interval that it is in optical communication with the entrance aperture 149 of optical system 169.

Once an LED passes aperture 149, its pulse output is terminated and current is delivered to the adjacent LED 149 which emits a high brightness pulse of light. When the next LED 149 is pulsed on, it is positioned in communication with the aperture 149 so that its light is now collected and delivered to optical system 160. The LED that was previously pulsed on is no longer in communication with the optical system, and may be turned off until it is once again rotated to be in communication with aperture 149.

This sequence continues in a circular manner by rotation of the drum. The velocity of rotation of the drum is synchronized with the pulses of the LEDs and their location relative to the optical system.

Assume, for example, that 100 LEDs are mounted around the perimeter of a rotating drum. Each LED emits light from an area of about 1 mm diameter and occupies an area of 10 mm diameter such the drum diameter is about 320 mm. Assuming, for example, that the LED's are pulsed in sequence for a light duration of about 1 msec and the drum rotates at a speed of about 600 RPM, quasi-CW illumination is achieved. In this example, the duty cycle of the LED's is 1%. Accordingly, there is ample time is for each individual LED to cool down between pulses to minimize thermal degradation and optimize pulsed light output. In accordance with an embodiment of the invention, electricity is provided to the rotating LEDs using, for example, a brush mechanism similar to those found in DC electrical motors.

It is noted that in general the embodiment employing a rotating mirror is easier to implement mechanically compared to the embodiment employing a rotating drum; moreover current supply is easier to supply to stationary LEDs compared to rotating LEDs. One advantage, however, of the embodiment employing a rotating drum lies is in the ability to place the LEDs in relatively close proximity to the optical elements of the optical system.

Illumination provided by the above systems can be used for various applications requiring high brightness light. For example, one typical application is as an illumination source for an exposure apparatus used in photolithography. Photolithography is employed in the electronics industry to make printed circuit boards and integrated chips. It is also used, for example, in the graphic arts industry to produce printing plates.

In accordance with an embodiment of the invention, LEDs commercial available from Nichia Corporation of Japan emit about 100 mW of UV light (less than about 400 nm) from a chip having a light emitting area of about 1 mm$^2$ and a total area of about 10 mm$^2$. Light from the LED is coupled by a condenser lens to a light valve or other modulator. In accordance with an embodiment of the invention, the light valve is an Liquid Crystal Display (LCD) panel, a Grating Light Valve (GLV) or a Digital Micromirror Device (DMD) type array of selectably positionable micro mirrors (available from Texas Instrument of Texas, USA). DMD devices are designed for projection displays and typically comprise about 1000×1000 addressable individual pixels or mirrors. The light source, as described hereinabove, may be adapted for use in photolithography devices using any suitable modulator, for example, one of the above modulators. Suitable photolithography systems for which an illuminator in accordance with the present invention may be adapted are described in one or more of the following U.S. patents, the disclosures of which are incorporated by reference in their entirety: U.S. Pat. No. 6,473,237, U.S. Pat. No. 6,425,669, U.S. Pat. No. 6,379,867, U.S. Pat. No. 6,133,986.

The photolithography devices described in the above patents, by way of example only, employ a DMD as a spatial light modulator operative to deliver light to, or divert light from, pixel locations whereat an image is to be recorded. Thus in these photolithography systems, each addressable pixel on the modulator may be in either an on or off state such that light that impinges thereon selectably exits so as to reach a surface in a selectable pattern which is to be recorded.

In photolithography applications, the light modulated by the modulator is projected in a selectable pattern onto a substrate coated with photoresist. The surface of the light valve is patterned according to a predetermined pattern. Light impinging on the surface of the valve pattern is, for example, scanned onto the photoresist by a projection lens or otherwise imaged onto the surface. The image activates chemical reaction in the photoresist to record an image which can be processed later.

It is appreciated that a minimum threshold quantity of energy needs to be delivered to the photoresist in order to activate a chemical reaction therein. Inasmuch as light energy is a function of time and power, the increased light power reduces the time necessary for exposure. Exposure time translates into system throughput which dictates the cost effectiveness of the machine. An exposure system which is able, for example, to reduce exposure time by half will be able to output patterns on twice as many substrates, thereby offering a manufacturer a significant competitive advantage. Because photoresist energy requirement are set by limits associated with the chemistry involved, increasing the brightness of the light source driving exposure apparatus is an effective way to improve system throughput. It is thus appreciated that embodiments of the invention enable a significant improvement in light brightness of exposure equipment used in photolithography even when using relatively low-cost and relatively low brightness solid state light emitters, such as LEDs.

Other applications in which high-brightness light sources are required are in the machine vision industry. In machine vision applications, a light sensor such as a CCD or CMOS camera, is used to acquire an image of an article to be inspection. One parameter influencing the quality of an acquired image is the strength of an optical signal, that is to say the amount of light collected from each portion of a surface to be imaged. This signal is related to brightness of the source and the collection time. For a given required signal, the speed of image acquisition greatly depends on the brightness of the light source brightness. Thus, embodiments of the invention described herein enable machine vision systems to increase the brightness of illuminating systems to improve high throughput inspection.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

What is claimed is:

1. An illumination system, comprising:
   a plurality of solid state light emitters disposed relative to a location and operative to emit light to impinge on said location; and
   a scanner operative to sequentially receive light from said plurality of solid state light emitters at said location at essentially the same angle of incidence and to provide a time-multiplexed light output.

2. The illumination system claimed in claim 1, wherein said solid state light emitters are operative in a pulsed mode.

3. The illumination system claimed in claim 2, wherein said so lid state light emitters are operative to output light pulses in a sequence.

4. The illumination system claimed claim 2, wherein operation of said solid state light emitters in said pulsed mode is synchronized with operation of said scanner such that light from each of said solid state light emitters is received by said scanner at a time corresponding to a light a output of said light emitter.

5. The illumination system claimed in claim 2, wherein said so lid state light emitters receive a current pulse substantially higher than a steady state operation current rating to emit light in said pulsed mode.

6. The illumination system claimed in claim 5, wherein a brightness of light pulses emitted by said solid state light emitters when operating in a pulsed mode is greater than a brightness of light emitted by said solid state light emitters when operating in a steady state of operation.

7. The illumination system claimed in claim 2, wherein said light emitters are arranged in a loop.

8. The illumination system claimed in claim 7, wherein said scanner is disposed generally at the center of said loop.

9. The illumination system claimed in claim 8, wherein said scanner comprises a rotating mirror angled to receive light emitted by said light emitters at the same angle of incidence, and project the light to an optical system.

10. The illumination system claimed in claim 8, wherein said light emitters are configured to emit pulsed light in a sequence, and said scanner rotates synchronously with said emission of pulsed light to receive pulsed light from a light emitter as said light emitter is pulsed.

11. The illumination system claimed in claim 1, wherein said solid state light emitters comprise light emitting diodes.

12. The illumination system claimed in claim 1, wherein said solid state light emitters comprise diode lasers.

13. A system for recording information on a surface, comprising:
   a plurality of solid state light emitters operative to sequentially output pulsed light;
   a scanner operative to sequentially receive pulsed light from said plurality of solid state light emitters and to output a combined beam of light including light pulses from a more than one solid state light emitter;
   a modulator operative to modulate said combined beam; and
   an image scanner operative to scan said modulated combined beam to record a pattern on a photosensitized surface.

14. The system claimed in claim 13, wherein said combined beam has an intensity characteristic that is increased relative to an intensity characteristic of one of said solid state light emitters when operating in a continuous mode of operation.

15. The system claimed in claim 13, wherein said combined beam has a brightness characteristic that is increased relative to a brightness characteristic of one of said solid state light emitters when operating in a continuous mode of operation.

16. The system claimed in claim 13, wherein said scanner is operative to time multiplex pulses from said solid state light emitters to generate said combined beam.

17. The system claimed in claim 13, wherein said modulator is a spatial light modulator.

18. The system claimed in claim 13, wherein said solid state light emitters comprise light emitting diodes.

19. The system claimed in claim 18, wherein said light emitting diodes output light having a spectral wavelength of less than 400 nm.

20. The system claimed in claim 13, wherein said solid state light emitters comprise diode lasers.

21. A method for generating a light beam, comprising:
   disposing a plurality of solid state light emitters relative to a location;
   emitting light from a plurality of solid state light emitters to impinge on said location; and
   scanning said emitters to sequentially receive light at said location at essentially the same angle of incidence and to provide a time-multiplexed light output.

22. The method claimed in claim 21, wherein said emitting light comprises operating said solid state light emitters in a pulsed mode.

23. The method claimed in claim 22, wherein emitting light comprises outputting light pulses in a sequence.

24. The method claimed claim 22, wherein said operating comprises emitting light in synchronization with operation of said scanner such that light from each of said solid state light emitters is received by said scanner at a time corresponding to a light a output of said light emitter.

25. The method claimed in claim 22, wherein said emitting light comprises intermittently supplying a current pulse to a solid state light emitter, the current pulse being of substantially higher power than a steady state operation current rating thereby causing said solid state light emitter to emit light in said pulsed mode.

26. The method claimed in claim 25, wherein a brightness of light pulses emitted by said solid state light emitters when operating in a pulsed mode is greater than a brightness of light emitted by said solid state light emitters when operating in a steady state of operation.

27. The method claimed in claim 22, further comprising arranging said light emitters in a loop.

28. The method claimed in claim 27, further comprising positioning said scanner generally at the center of said loop.

29. The method claimed in claim 28, wherein said emitting comprises emitting pulsed light in a sequence, and wherein said scanning comprises rotating said scanner synchronously with said emission of pulsed light to receive pulsed light from a light emitter as said light emitter is pulsed.

30. The method claimed in claim 21, wherein emitting light from solid state light emitters comprises emitting light from light emitting diodes.

31. The method claimed in claim 21, wherein emitting light from solid state light emitters comprises emitting light from diode lasers.

32. A method for recording information on a surface, comprising:
   sequentially outputting pulsed light from solid state light emitters;
   sequentially receiving pulsed light from said plurality of solid state light emitters and outputting a combined beam of light including light pulses from a more than one solid state light emitter;
   modulating said combined beam; and
   scanning said modulated combined beam to record a pattern on a photosensitized surface.

33. The system claimed in claim 32, wherein said outputting a combined beam comprises outputting a beam having an intensity characteristic that is increased relative to an intensity characteristic of one of said solid state light emitters when operating in a continuous mode of operation.

34. The system claimed in claim 32, wherein said outputting a combined beam comprises outputting a beam having a brightness characteristic that is increased relative to a brightness characteristic of one of said solid state light emitters when operating in a continuous mode of operation.

35. The system claimed in claim 32, further comprising time multiplexing pulses from said solid state light emitters to generate said combined beam.

36. The system claimed in claim 32, wherein said modulating comprises modulating said combined beam with a spatial light modulator.

37. The system claimed in claim 32, wherein said outputting pulsed light comprises outputting pulsed light from light emitting diodes.

38. The system claimed in claim 37, outputting pulsed light from light emitting diodes comprises outputting pulsed light having a spectral wavelength of less than 400 nm.

39. The system claimed in claim 32, wherein said outputting pulsed light comprises outputting pulsed light from diode lasers.

* * * * *